United States Patent
Sasaki (10) Patent No.: US 8,637,170 B2
(45) Date of Patent: Jan. 28, 2014

(54) MAGNETIC SENSOR INCLUDING A FREE MAGNETIZATION LAYER AND A FIXED MAGNETIZATION LAYER ON A NONMAGNETIC CONDUCTOR

(75) Inventor: Tomoyuki Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 703 days.

(21) Appl. No.: 12/471,995

(22) Filed: May 26, 2009

(65) Prior Publication Data

US 2009/0323230 A1 Dec. 31, 2009

(30) Foreign Application Priority Data

Jun. 25, 2008 (JP) ................................ 2008-166175

(51) Int. Cl.
*G01R 33/09* (2006.01)
*H01F 10/08* (2006.01)

(52) U.S. Cl.
USPC ............... 428/811; 428/811.2; 428/811.5; 365/52; 365/54; 365/55; 365/158

(58) Field of Classification Search
None
See application file for complete search history.

(56) References Cited

U.S. PATENT DOCUMENTS

| | | | |
|---|---|---|---|
| 7,209,328 B2 * | 4/2007 | Ito et al. | 360/324.2 |
| 7,253,995 B2 | 8/2007 | Takahashi et al. | |
| 7,280,322 B2 | 10/2007 | Takahashi et al. | |
| 7,298,597 B2 | 11/2007 | Carey et al. | |
| 7,349,186 B2 | 3/2008 | Ito | |
| 7,492,631 B1 * | 2/2009 | Assefa et al. | 365/171 |
| 7,522,392 B2 | 4/2009 | Carey et al. | |
| 7,598,578 B2 | 10/2009 | Nakamura et al. | |
| 7,678,475 B2 * | 3/2010 | Slavin et al. | 428/811 |
| 7,755,928 B2 | 7/2010 | Anezaki et al. | |
| 7,755,929 B2 * | 7/2010 | Inomata et al. | 365/158 |
| 8,085,513 B2 | 12/2011 | Sasaki | |
| 8,238,064 B2 | 8/2012 | Yamada et al. | |
| 2005/0111138 A1 | 5/2005 | Yamakawa et al. | |
| 2006/0262458 A1 * | 11/2006 | Carey et al. | 360/324.2 |
| 2007/0127162 A1 | 6/2007 | Nishiyama et al. | |
| 2007/0253116 A1 * | 11/2007 | Takahashi | 360/313 |
| 2007/0253121 A1 | 11/2007 | Yamada et al. | |

FOREIGN PATENT DOCUMENTS

| | | |
|---|---|---|
| EP | 1 052 520 B1 | 7/2005 |
| JP | A-2000-323767 | 11/2000 |
| JP | A-2003-008105 | 1/2003 |
| JP | A-2005-209248 | 8/2005 |
| JP | A-2007-88068 | 4/2007 |

(Continued)

OTHER PUBLICATIONS

U.S. Appl. No. 12/471,909, filed May 26, 2009 in the name of Tomoyuki Sasaki.

(Continued)

*Primary Examiner* — Kevin Bernatz
(74) *Attorney, Agent, or Firm* — Oliff & Berridge, PLC (57) ABSTRACT

A magnetic sensor comprises a support; a nonmagnetic conductive layer disposed on the support; a fixed magnetization layer disposed on a first part of the nonmagnetic conductive layer and on the support; a free magnetization layer disposed on a second part of the nonmagnetic conductive layer different from the first part and on the support; and a nonmagnetic low resistance layer, disposed on a part overlapping the nonmagnetic conductive layer in at least one of the fixed magnetization layer and free magnetization layer, having an electrical resistivity lower than that of the one layer.

11 Claims, 6 Drawing Sheets

(56) References Cited

FOREIGN PATENT DOCUMENTS

| JP | A-2007-157252 | 6/2007 |
|---|---|---|
| JP | A-2007-294710 | 11/2007 |
| JP | A-2007-299467 | 11/2007 |
| JP | B2-4029772 | 1/2008 |
| JP | A-2009-146512 | 7/2009 |

OTHER PUBLICATIONS

U.S. Appl. No. 12/608,583, filed Oct. 29, 2009 in the name of Tomoyuki Sasaki.
U.S. Appl. No. 12/471,804, filed May 26, 2009 in the name of Tomoyuki Sasaki.
Sep. 29, 2011 Office Action issued in U.S. Appl. No. 12/471,804.
Oct. 11, 2011 Notice of Allowance issued in U.S. Appl. No. 12/608,583.
Office Action issued in Japanese Patent Application No. 2008-284307 dated May 21, 2013.
Mar. 19, 2012 Office Action issued in U.S. Appl. No. 12/471,804.
Apr. 20, 2012 Office Action issued in U.S. Appl. No. 12/471,909.

* cited by examiner

MAGNETIC SENSOR INCLUDING A FREE MAGNETIZATION LAYER AND A FIXED MAGNETIZATION LAYER ON A NONMAGNETIC CONDUCTOR

BACKGROUND OF THE INVENTION

1. Field of the Invention

The present invention relates to a magnetic sensor.

2. Related Background Art

As magnetic sensors used in thin-film magnetic recording and reproducing heads and the like, magnetoresistive (MR) devices have conventionally been known. In general, the MR devices cause a current to flow between a fixed magnetization layer and a free magnetization layer and thus attain high outputs. In the MR devices, however, domain wall movements due to spin torques given by the current and the like yield signals unnecessary for the magnetic sensors.

On the other hand, a spin accumulation (SA) magnetic sensor in which a free magnetization layer and a fixed magnetization layer are formed on the same horizontal surface (nonmagnetic conductive layer for accumulating spins) has been known (see, for example, Japanese Patent Application Laid-Open No. 2007-299467 and Japanese Patent Publication No. 4029772). When a spin accumulation magnetic sensor is used for a thin-film magnetic recording and reproducing head, for example, it is unnecessary for a current to flow through a free magnetization layer which senses external magnetic fields of a magnetic recording medium and the like. Hence, the spin accumulation magnetic sensor can detect a magnetic state as an output voltage by utilizing a spin current alone. Therefore, the spin accumulation magnetic sensor is less likely to observe unnecessary signals which are seen in the M devices.

SUMMARY OF THE INVENTION

Meanwhile, from the viewpoint of making a thin or ultrasmall sensor, it may be configured such that a nonmagnetic conductive layer is disposed on a support, a fixed magnetization layer is disposed on a first part of the nonmagnetic conductive layer and on the support, a free magnetization layer is disposed on a second part of the nonmagnetic conductive layer different from the first part and on the support, a current is applied from an end part of the fixed magnetization layer not overlapping the nonmagnetic conductive layer to the nonmagnetic conductive layer through a part of the fixed magnetization layer overlapping the nonmagnetic conductive layer, and a voltage is taken out from an end part of the free magnetization layer not overlapping the nonmagnetic conductive layer through a part of the free magnetization layer overlapping the nonmagnetic conductive layer.

However, the free magnetization layer and fixed magnetization layer are likely to have an electrical resistivity greater than that of the nonmagnetic conductive layer. Therefore, when the current is caused to flow from the end part of the fixed magnetization layer not overlapping the nonmagnetic conductive layer to the nonmagnetic conductive layer, a spin current may selectively be supplied from a location in the part of the fixed magnetization layer overlapping the nonmagnetic conductive layer near the end part of the fixed magnetization layer not overlapping the nonmagnetic conductive layer to the nonmagnetic conductive layer, whereby locations at which spins are injected into the nonmagnetic conductive layer and at which their diffusion starts are likely to be distributed unevenly. Also, the resistance of the free magnetization layer per se may make it difficult to detect a voltage occurring in the part of the free magnetization layer overlapping the nonmagnetic conductive layer at a location remote from the end part not overlapping the nonmagnetic conductive layer. It has therefore been found that the degree of freedom in designing positions of an electrode for injecting the current into the fixed magnetization layer and an electrode for detecting the voltage of the free magnetization layer is low, whereby they are hard to design optimally.

In view of the circumstances mentioned above, it is an object of the present invention to provide a magnetic sensor exhibiting a high degree of freedom in designing current injecting positions and output voltage detecting positions.

For achieving the above-mentioned problem, the magnetic sensor in accordance with the present invention comprises a support; a nonmagnetic conductive layer disposed on the support; a fixed magnetization layer disposed on a first part of the nonmagnetic conductive layer and on the support; a free magnetization layer disposed on a second part of the nonmagnetic conductive layer different from the first part and on the support; and a nonmagnetic low resistance layer, disposed on a part overlapping the nonmagnetic conductive layer in at least one of the fixed magnetization layer and free magnetization layer, having an electrical resistivity lower than that of the one layer.

The electrical resistivity, which is also known as specific resistance or volume resistivity, is a value intrinsic to each material. Assuming that the electrical resistivity is $\rho$ ($\Omega$cm), the length of the material is L (cm), and the cross-sectional area of the material is S (cm$^2$), the resistance R ($\Omega$), which is a scale of conductivity of the material, is represented by the following expression:

$$R = \rho L/S \tag{Eq. 1}$$

In the magnetic sensor of the present invention, on a part overlapping the nonmagnetic conductive layer in at least one of the fixed magnetization layer and free magnetization layer, a nonmagnetic low resistance layer having an electrical resistivity lower than that of the one layer is disposed. Therefore, when the one layer is the fixed magnetization layer, a spin current can easily be supplied from a wide area of the part of the fixed magnetization layer overlapping the nonmagnetic conductive layer to the nonmagnetic conductive layer. When the one layer is the free magnetization layer, on the other hand, a voltage caused by an interaction of spins can efficiently be taken out from a wide area of the part of the free magnetization layer overlapping the nonmagnetic conductive layer.

Preferably, in the magnetic sensor of the present invention, the nonmagnetic low resistance layer is disposed on the one layer so as to extend from the part overlapping the nonmagnetic conductive layer to a part on the support. When the one layer is the fixed magnetization layer in this case, currents are likely to flow mainly through the nonmagnetic low resistance layer, whereby it becomes easier to supply the spin current from a wide area of the part of the fixed magnetization layer overlapping the nonmagnetic conductive layer to the nonmagnetic conductive layer. When the one layer is the free magnetization layer, on the other hand, the voltage caused by the interaction of spins can more efficiently be taken out from a wide area of the part of the free magnetization layer overlapping the nonmagnetic conductive layer.

Preferably, in the magnetic sensor of the present invention, the nonmagnetic conductive layer has an electric resistivity lower than that of the one layer.

In this case, the current having flowed through the one layer and nonmagnetic low resistance layer is likely to flow into the nonmagnetic conductive layer, whereby the current injection into the magnetic sensor can be achieved favorably.

Preferably, in the magnetic sensor of the present invention, the fixed magnetization layer and free magnetization layer are provided with a coercive force difference therebetween by a shape anisotropy.

Imparting a shape anisotropy to the fixed magnetization layer and free magnetization layer makes it easier for the direction of magnetization of the fixed magnetization layer to become less susceptible to external magnetic fields and for the direction of magnetization of the free magnetization layer to become more susceptible to the external magnetic fields.

Preferably, the magnetic sensor of the present invention further comprises an antiferromagnetic layer disposed on the fixed magnetization layer, while the antiferromagnetic layer fixes a direction of magnetization of the fixed magnetization layer.

Disposing the antiferromagnetic layer on the fixed magnetization layer makes it easier for the direction of magnetization of the fixed magnetization layer to become less susceptible to the external magnetic fields.

Preferably, in the magnetic sensor of the present invention, the fixed magnetization layer has a coercive force greater than that of the free magnetization layer.

This can favorably materialize the fixed magnetization layer and free magnetization layer in the magnetic sensor.

Preferably, in the magnetic sensor of the present invention, the nonmagnetic low resistance layer is provided on each of the fixed magnetization layer and free magnetization layer.

This improves the degree of freedom in designing wiring in particular and makes it possible to efficiently detect the spin current.

Preferably, in the magnetic sensor of the present invention, the fixed magnetization layer is made of an alloy or oxide containing at least one element selected from the group consisting of B, V, Cr, Mn, Fe, Co, and Ni.

These materials are ferromagnetic materials having a high spin polarizability and thus can favorably actualize the fixed magnetization layer in the magnetic sensor.

Preferably, in the magnetic sensor of the present invention, the free magnetization layer is made of an alloy or oxide containing at least one element selected from the group consisting of B, V, Cr, Mn, Fe, Co, and Ni.

These materials are soft magnetic materials and thus can favorably actualize the free magnetization layer in the magnetic sensor.

Preferably, in the magnetic sensor of the present invention, the nonmagnetic low resistance layer is made of a metal selected from the group consisting of Mg, Al, Cu, Zn, Ag, Au, and Pt or an alloy containing at least one element in the group.

These materials have a low electrical resistance and thus can favorably actualize the nonmagnetic low resistance layer in the magnetic sensor.

The present invention can provide a magnetic sensor having a high degree of designing current injecting positions and output voltage detecting positions.

DESCRIPTION OF THE PREFERRED EMBODIMENTS

In the following, embodiments of the present invention will be explained in detail with reference to the accompanying drawings. In the explanation of the drawings, the same constituents will be referred to with the same signs while omitting their overlapping descriptions. Ratios of dimensions in the drawings do not always coincide with those in practice.

First Embodiment

An example of the spin accumulation magnetic sensor in accordance with the first embodiment will now be explained.

Figure 1:
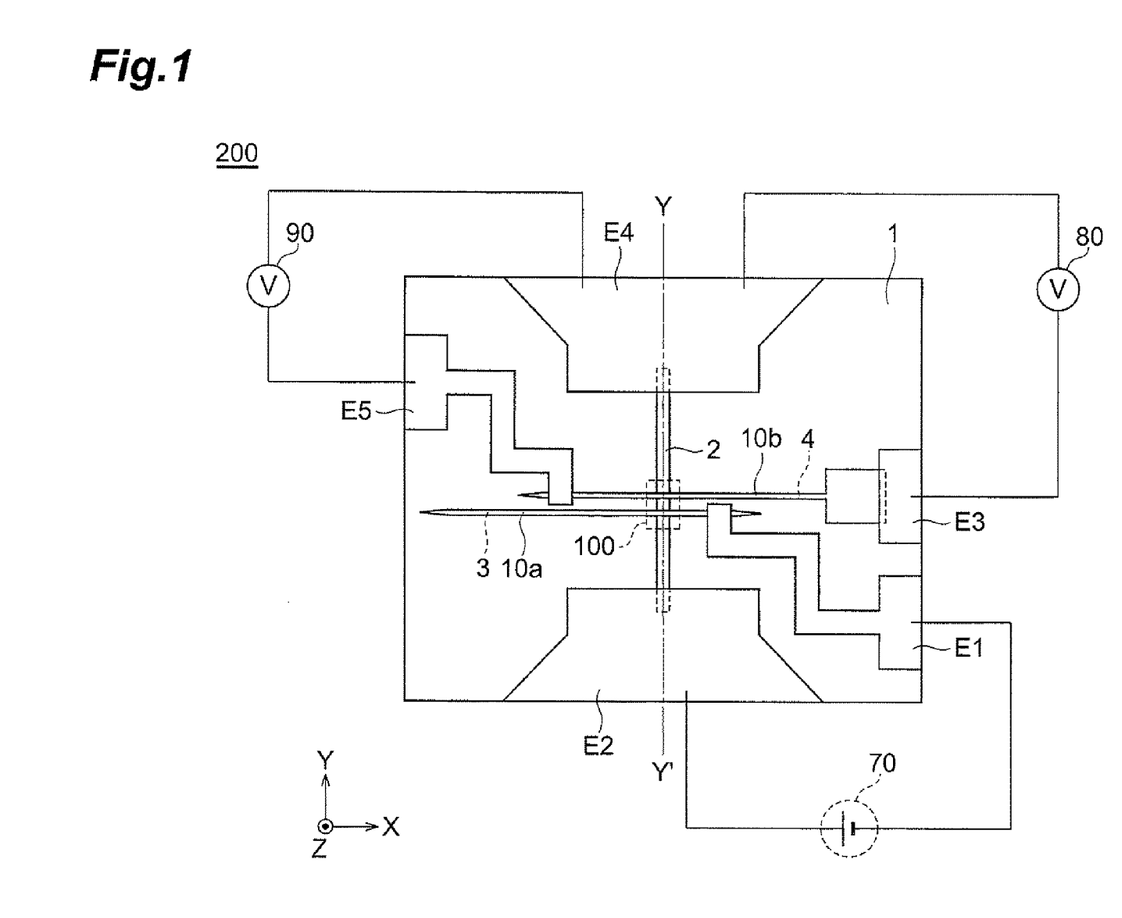
FIG. 1 is a schematic top plan view illustrating a magnetic sensor 200.
Figure 2:
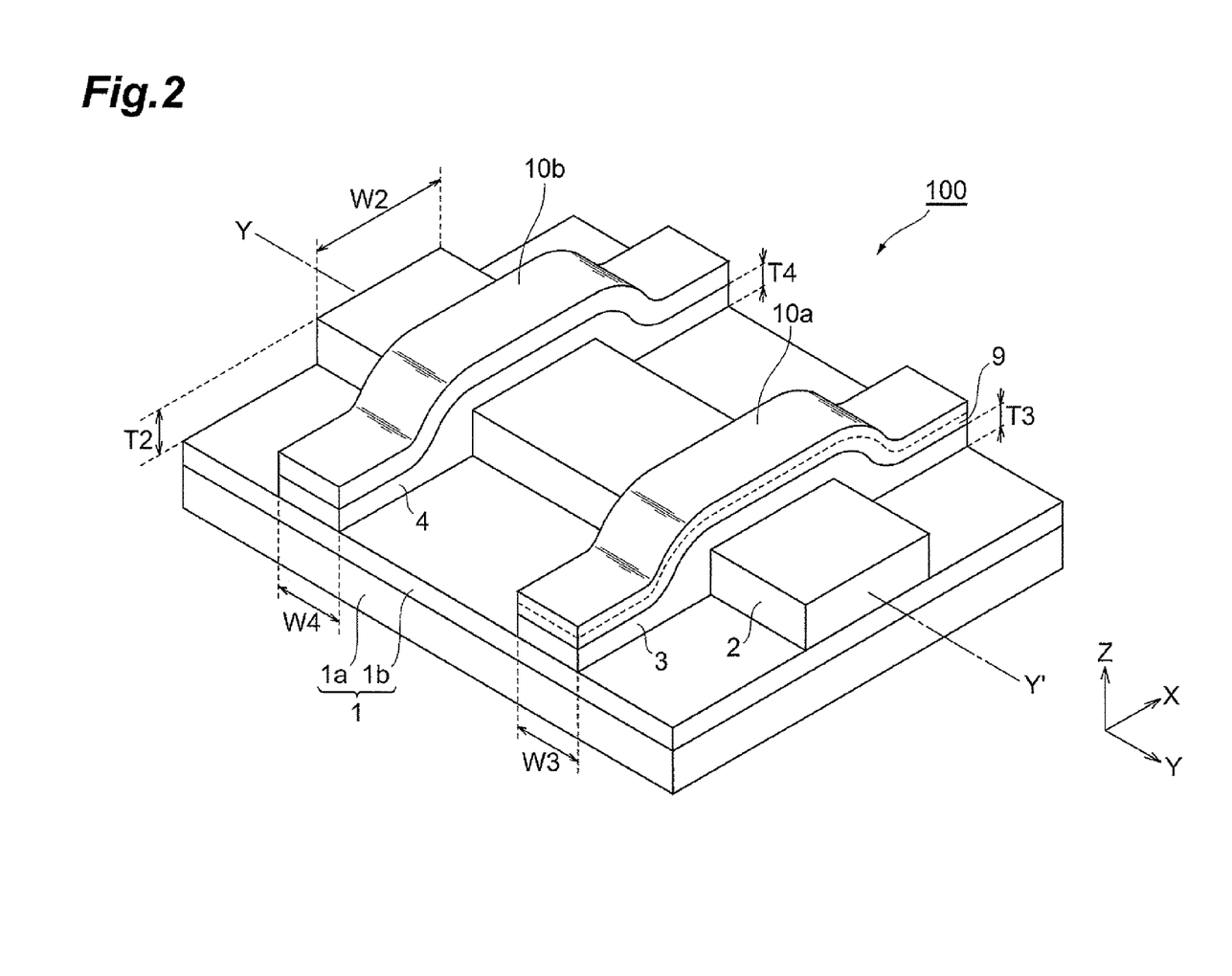
FIG. 2 is a perspective view corresponding to a dashed box 100 in FIG. 1.

FIG. 1 is a schematic top plan view illustrating a magnetic sensor 200. FIG. 2 is a perspective view corresponding to a dashed box 100 in FIG. 1. The line Y-Y' illustrated in FIG. 1 corresponds to the line Y-Y' of FIG. 2.

As illustrated in FIGS. 1 and 2, the magnetic sensor 200 mainly comprises a support 1, a nonmagnetic conductive layer 2 disposed thereon for accumulating spins of electrons, a fixed magnetization layer 3 disposed on a first part of the nonmagnetic conductive layer 2 and on the support 1, a free magnetization layer 4 disposed on a second part of the nonmagnetic conductive layer 2 different from the first part and on the support 1, a nonmagnetic low resistance layer 10a disposed on the fixed magnetization layer 3, and a nonmagnetic low resistance layer 10b disposed on the free magnetization layer 4.

Support

As the support 1, a substrate alone or one in which a foundation film 1b such as an insulating film or metal film is formed on a substrate 1a (see FIG. 2) can be used, for example. Examples of the substrate include glass, $SiO_2$, MgO, GaAs, AlTiC, SiC, and $Al_2O_3$ substrates. An example of the insulating film is alumina.

Nonmagnetic Conductive Layer

The nonmagnetic conductive layer 2 is a layer which accumulates spins by spin injections. The nonmagnetic conductive layer 2 is disposed on the support 1 so as to exhibit a rectangular form whose shorter and longer axes lie in the X and Y directions, respectively. The electrical resistivity of the nonmagnetic conductive layer 2 is lower than that of the fixed magnetization layer 3 and free magnetization layer 4.

A nonferromagnetic conductive material is used for making the nonmagnetic conductive layer 2. Preferably, a material having a long spin-diffusion length and a relatively low conductivity is selected for making the nonmagnetic conductive layer 2. An example of the material for the nonmagnetic conductive layer 2 is one containing at least one element selected from the group consisting of B, C, Mg, Al, Ag, and Cu. Specific examples include Cu and Al. The width W2 (length in the X direction illustrated in FIG. 2) of the nonmagnetic conductive layer 2 can be 10 to 500 nm, for example. The thickness T2 (length in the Z direction illustrated in FIG. 2) of the nonmagnetic conductive layer 2 can be 10 to 100 nm, for example.

Fixed Magnetization Layer

The fixed magnetization layer 3 is a layer for injecting electrons having predetermined spins into the nonmagnetic conductive layer 2. The fixed magnetization layer 3 is disposed on the nonmagnetic conductive layer 2 so as to extend in the X and Y direction as longer and shorter axis directions, respectively, and has respective parts overlapping and not overlapping the nonmagnetic conductive layer 2. The longer axis direction of the fixed magnetization layer 3 (X direction) extends in a direction substantially orthogonal to the longer axis direction of the nonmagnetic conductive layer 2 (Y direction). As illustrated in FIG. 1, the fixed magnetization layer 3 has a two-dimensional form in which both longitudinal ends are pointed.

Usable as a material for the fixed magnetization layer 3 is a ferromagnetic metal material having a high spin polarizability, examples of which include alloys and oxides containing at least one element selected from the group consisting of B, V, Cr, Mn, Fe, Co, and Ni. Specific examples include CoFe and FeMn. The width W3 (length in the Y direction illustrated in FIG. 2) of the fixed magnetization layer 3 can be 50 to 500 nm, for example. The thickness T3 (length in the Z direction illustrated in FIG. 2) of the fixed magnetization layer 3 can be 10 to 100 nm, for example.

The coercive force of the fixed magnetization layer 3 is greater than that of the free magnetization layer 4. Preferably, the magnetization of the fixed magnetization layer 3 is fixed by at least one of a magnetization fixing method using an antiferromagnetic layer 9 which will be explained later and a magnetization fixing method based on a shape anisotropy of the fixed magnetization layer 3. This can make the direction of magnetization of the fixed magnetization layer 3 less susceptible to external magnetic fields.

When a magnetization fixing method using an antiferromagnetic layer 9 is employed as the method of fixing the magnetization of the fixed magnetization layer 3, the antiferromagnetic layer 9 is disposed on the fixed magnetization layer 3. In this case, the nonmagnetic low resistance layer 10a is disposed on the antiferromagnetic layer 9.

When the antiferromagnetic layer 9 is exchange-coupled with the fixed magnetization layer 3, the direction of magnetization of the fixed magnetization layer 3 can be fixed (provided with a unidirectional anisotropy). This yields the fixed magnetization layer 3 having a higher coercive force in one direction than in the case without the antiferromagnetic layer 9. Therefore, a material used in the antiferromagnetic layer 9 is selected with reference to the material used in the fixed magnetization layer 3.

Examples of the material for the antiferromagnetic layer 9 include antiferromagnetic alloys using Mn, which are specifically alloys containing Mn and at least one element selected from Pt, Ir, Fe, Ru, Cr, Pd, and Ni. More specific examples include IrMn and PtMn.

On the other hand, the antiferromagnetic layer 9 can be omitted when employing a method of fixing the magnetization of the fixed magnetization layer 3 by imparting a shape anisotropy to the fixed magnetization layer 3. For example, the fixed magnetization layer 3 is shaped into a rectangular form whose longer axis lies in the X direction when seen from the Z direction. The magnetization may be fixed by both of the antiferromagnetic layer 9 and shape anisotropy as a matter of course.

Free Magnetization Layer

The free magnetization layer 4 is a layer for detecting an external magnetic field and sharply sensing a change in the direction of magnetization of a magnetic recording medium and the like. For example, the free magnetization layer 4 can favorably read magnetic information from a magnetic recording medium when placed close thereto.

The longer axis direction of the free magnetization layer 4 (X direction) extends in a direction substantially orthogonal to the longer axis direction of the nonmagnetic conductive layer 2 (Y direction), thereby yielding respective parts overlapping and not overlapping the nonmagnetic conductive layer 2. The longer axis direction of the free magnetization layer 4 (X direction) also extends in a direction substantially parallel to the longer axis direction of the fixed magnetization layer 3 (X direction). As illustrated in FIG. 1, the free magnetization layer 4 is formed such that one longitudinal end is pointed while the other end has a wider rectangular part.

The free magnetization layer 4 is separated from the fixed magnetization layer 3 by a predetermined distance. Specifically, the free magnetization layer 4 is placed lower than the fixed magnetization layer 3 in FIG. 1. The distance between the free magnetization layer 4 and fixed magnetization layer 3 can be 20 to 350 nm, for example.

Employable as the free magnetization layer 4 is a ferromagnetic material, a soft magnetic material in particular, examples of which include alloys and oxides containing at least one element selected from the group consisting of B, V, Cr, Mn, Fe, Co, and Ni. Specific examples include CoFeB and NiFe. The width W4 (length in the Y direction illustrated in FIG. 2) of the free magnetization layer 4 can be 50 to 500 nm, for example. The thickness T4 (length in the Z direction illustrated in FIG. 2) of the free magnetization layer 4 can be 10 to 100 nm, for example.

Nonmagnetic Low Resistance Layer

The nonmagnetic low resistance layers 10a, 10b are disposed on the fixed magnetization layer 3 and free magnetization layer 4, respectively.

The nonmagnetic low resistance layer 10a has an electrical resistivity lower than that of the fixed magnetization layer 3, while the nonmagnetic low resistance layer 10b has an electrical resistivity lower than that of the free magnetization layer 4.

Examples of materials for the nonmagnetic low resistance layers 10a, 10b include metals selected from the group consisting of Mg, Al, Cu, Zn, Ag, Au, and Pt and alloys containing at least one element in the group. Specific examples include Cu and AuCu. In this embodiment, the nonmagnetic low resistance layers 10a, 10b cover the whole upper faces of the fixed magnetization layer 3 and free magnetization layer 4, respectively, and have respective forms similar to those of the fixed magnetization layer 3 and free magnetization layer 4 when seen from a direction perpendicular to the support 1.

A cap layer (not illustrated) for preventing the fixed magnetization layer 3, free magnetization layer 4, and the like from deteriorating may be disposed on the nonmagnetic low resistance layers 10a, 10b. Examples of the material for the cap layer include metals selected from the group consisting of Al, Ru, Pt, Au, Ta, and Ti and alloys, oxides, nitrides, and the like containing at least one element in the group. Specific examples include Ta and Pt.

Electrode

In order for a detection current to flow into the fixed magnetization layer 3, an electrode E1 is connected to a part of the nonmagnetic low resistance layer 10a not overlapping the nonmagnetic conductive layer 2 (a right end part in FIG. 1), while an electrode E2 is connected to a lower end part of the nonmagnetic conductive layer 2 which is close to but does not overlap the fixed magnetization layer 3.

For detecting the output voltage, an electrode E3 is connected to a right end part of the nonmagnetic low resistance layer 10b not overlapping the nonmagnetic conductive layer 2, while an electrode E4 is connected to an upper end part of the nonmagnetic conductive layer 2 which is close to but does not overlap the free magnetization layer 4. For assisting the detection, an electrode E5 is connected to a left end part of the nonmagnetic low resistance layer 10b not overlapping the nonmagnetic conductive layer 2.

Examples of materials for the electrodes E1 to E5 include metal materials such as Cu, Cr, and Al.

Operations of the magnetic sensor 200 in accordance with the first embodiment will now be explained with reference to FIG. 1.

First, a detection current is caused to flow from a current source 70 connected to the electrodes E1 and E2 to the nonmagnetic low resistance layer 10a. Here, the detection current is easier to flow through the nonmagnetic low resistance layer 10a having an electrical resistivity lower than that of the fixed magnetization layer 3. The detection current flows through the nonmagnetic low resistance layer 10a mainly in the longer axis direction, so as to reach a part of the nonmagnetic low resistance layer 10a overlapping the nonmagnetic conductive layer 2 and then passes through the fixed magnetization layer 3, thereby flowing into the nonmagnetic conductive layer 2 substantially uniformly at least in the X direction.

Then, electrons having spins corresponding to the direction of magnetization of the fixed magnetization layer 3 are efficiently injected into the nonmagnetic conductive layer 2 from the interface between the fixed magnetization layer 3 and nonmagnetic conductive layer 2, whereby the spins diffuse within the nonmagnetic conductive layer 2 from the fixed magnetization layer 3 side to the free magnetization layer 4 side.

At the interface between the nonmagnetic conductive layer 2 and the free magnetization layer 4, a voltage output is generated by an interaction between the direction of magnetization of the free magnetization layer 4, i.e., a spin of electrons, variable according to an external magnetic field and a spin of electrons at the part of the nonmagnetic conductive layer 2 in contact with the free magnetization layer 4. In this embodiment, the voltage occurring between the nonmagnetic conductive layer 2 and free magnetization layer 4 can be determined by a voltmeter 80 disposed between the electrodes E3 and E4 or a voltmeter 90 disposed between the electrodes E5 and E4. Thus, the magnetic sensor 200 can be employed as an external magnetic field sensor.

Effects obtained by the magnetic sensor 200 in accordance with the first embodiment will now be explained.

In the magnetic sensor 200 in accordance with the first embodiment, the nonmagnetic low resistance layer 10a is disposed on the fixed magnetization layer 3. This makes it easy to supply a spin current to the nonmagnetic conductive layer 2 from a wide area of the part of the fixed magnetization layer 3 overlapping the nonmagnetic conductive layer 2. On the other hand, the nonmagnetic low resistance layer 10b is disposed on the free magnetization layer 4. Therefore, the voltage generated by the interaction of spins at the interface between the nonmagnetic conductive layer 2 and free magnetization layer 4 can efficiently be taken out from a wide area of the part of the free magnetization layer 4 overlapping the nonmagnetic conductive layer 2. These enhance the degree of freedom in designing current injecting positions and output voltage detecting positions by the electrodes E1 to E5, thereby making it easy to put them into practical use.

The magnetic sensor 200 of the present invention explained in the foregoing is applicable to various uses, e.g., magnetic encoder apparatus employed in small robots, digital cameras, and inkjet printers; thin-film magnetic recording and reproducing heads; magnetic field measuring apparatus; and magnetism detecting apparatus such as biosensors.

The present invention can be modified in various ways without being restricted to the above-mentioned embodiment. For example, though the above-mentioned embodiment is equipped with both of the nonmagnetic low resistance layers 10a, 10b, the present invention can be carried out by a structure equipped with one of the nonmagnetic low resistance layers 10a, 10b alone.

Though the nonmagnetic low resistance layers 10a and 10b are formed on the whole upper faces of the fixed magnetization layer 3 and free magnetization layer 4 in the above-mentioned embodiment, the present invention can be carried out as long as each of the nonmagnetic low resistance layers 10a, 10b is disposed on at least the part overlapping the nonmagnetic conductive layer 2.

Though the electrodes E1 to E5 for connecting with the current source 70 and voltmeters 80, 90 are directly in contact with the parts of the nonmagnetic low resistance layers 10a, 10b not overlapping the nonmagnetic conductive layer 2, the present invention can also be carried out when these electrodes are directly in contact with the parts of the fixed magnetization layer 3 and free magnetization layer 4 not overlapping the nonmagnetic conductive layer 2. This case also yields operations and effects similar to those mentioned above as long as the nonmagnetic low resistance layers 10a, 10b exist in the parts of the fixed magnetization layer 3 and free magnetization layer 4 overlapping the nonmagnetic conductive layer 2.

Though the above-mentioned embodiment explains a case injecting a current into the fixed magnetization layer 3 and detecting a voltage caused by an external magnetic field in the free magnetization layer 4, they may be reversed so as to inject a current into the free magnetization layer 4 and detect a voltage caused by an external magnetic field in the fixed magnetization layer 3.

The present invention will now be explained more specifically with reference to an example and a comparative example, though the present invention is not limited to the following example.

EXAMPLE 1

Method of Making Magnetic Sensor

Figure 3:
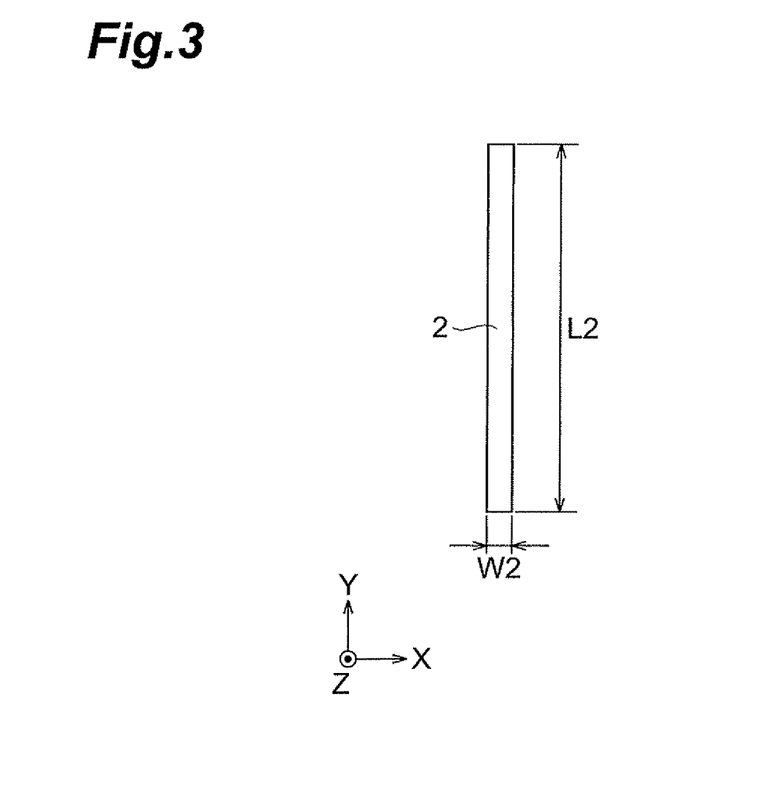
FIG. 3 is a schematic view for explaining the form of a nonmagnetic conductive layer 2.

First, a Cu film was formed on a support constituted by a substrate and a foundation film. Thus formed film was subsequently patterned by photolithography, so as to form a nonmagnetic conductive layer 2 having a rectangular form as illustrated in FIG. 3. The nonmagnetic conductive layer 2 had a length L2 in the longer axis direction (Y direction) of 20 μm, a length W2 in the shorter axis direction (X direction) of 0.5 μm, and a thickness T2 of 0.1 μm.

Figure 4A:
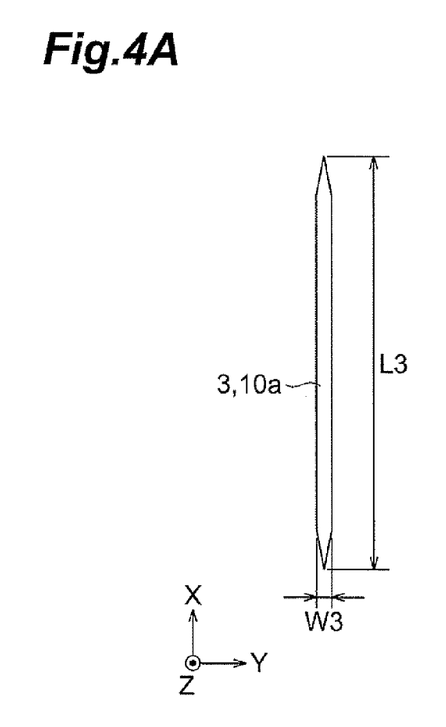
FIG. 4A is a schematic view for explaining forms of a fixed magnetization layer 3 and a nonmagnetic low resistance layer 10a, and FIG. 4B is a schematic view for explaining forms of a free magnetization layer 4 and a nonmagnetic low resistance layer 10b.
Figure 4B:
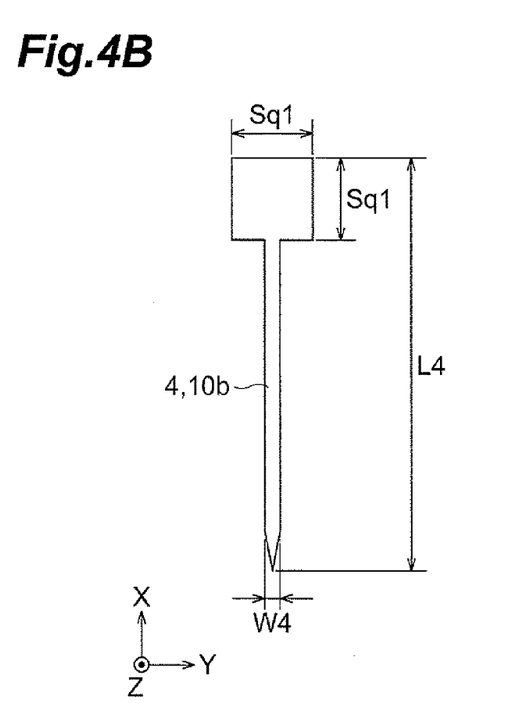

Then, a film (having a thickness of 50 nm) made of an alloy containing Co and Fe and a Cu film (having a thickness of 100 nm) were continuously formed on the nonmagnetic conductive layer 2 and patterned by photolithography, so as to form a fixed magnetic gap layer 3 and a nonmagnetic low resistance layer 10a each of which was shaped like a spear whose both end parts were pointed as illustrated in FIG. 4A, and a free magnetization layer 4 and a nonmagnetic low resistance layer 10b each of which was shaped into a form whose one end part was formed square while the other end part was pointed as illustrated in FIG. 4B.

Each of the fixed magnetization layer 3 and nonmagnetic low resistance layer 10a had a length L3 in the longer axis direction (X direction) of 15 μm and a length W3 in the shorter axis direction (Y direction) of 0.1 μm, while their total thickness was 0.1 μm. On the other hand, each of the free magnetization layer 4 and nonmagnetic low resistance layer 10b had a length L4 in the longer axis direction (X direction) of 20 μm, a length W4 in the shorter axis direction (Y direction) of 0.1 μm, and a square side length Sq1 of 4 μm, while their total thickness was 0.1 μm. Such shapes formed a coercive force difference between the fixed magnetization layer 3 and free magnetization layer 4. The distance between the fixed magnetization layer 3 and free magnetization layer 4 was 0.1 μm.

Next, a multilayer film having a Cr film and an Au film in order from the lower side was formed on the support, unnecessary parts of the film were removed by ion milling, and liftoff processing was carried out, whereby the electrodes E1 to E5 illustrated in FIG. 1 were formed.

Thus, the magnetic sensor of Example 1 having the same structure as that of the magnetic sensor 200 illustrated in FIG. 1 was obtained.

Evaluation of Output Voltage When Measuring External Magnetic Field

An external magnetic field was applied to the magnetic sensor made by Example 1, and an output voltage issued in response thereto was measured. The external magnetic field was in the order of 500 Oe. For injecting spins from the fixed magnetization layer 3 into the nonmagnetic conductive layer 2, a detection current from the current source 70 connected to the electrodes E1 and E2 was caused to flow from the fixed magnetization layer 3 to the nonmagnetic conductive layer 2. The voltage output caused by the change in magnetization of the free magnetization layer 4 was measured by the voltmeter 80 connected between the electrodes E3, E4 and the voltmeter 90 connected between the electrodes E4, E5.

As a result, the output voltage observed by the voltmeter 90, i.e., between the electrodes E5 and E4, was 0.93 when the output voltage observed by the voltmeter 80, i.e., between the electrodes E3 and E4, was 1.

Figure 5:
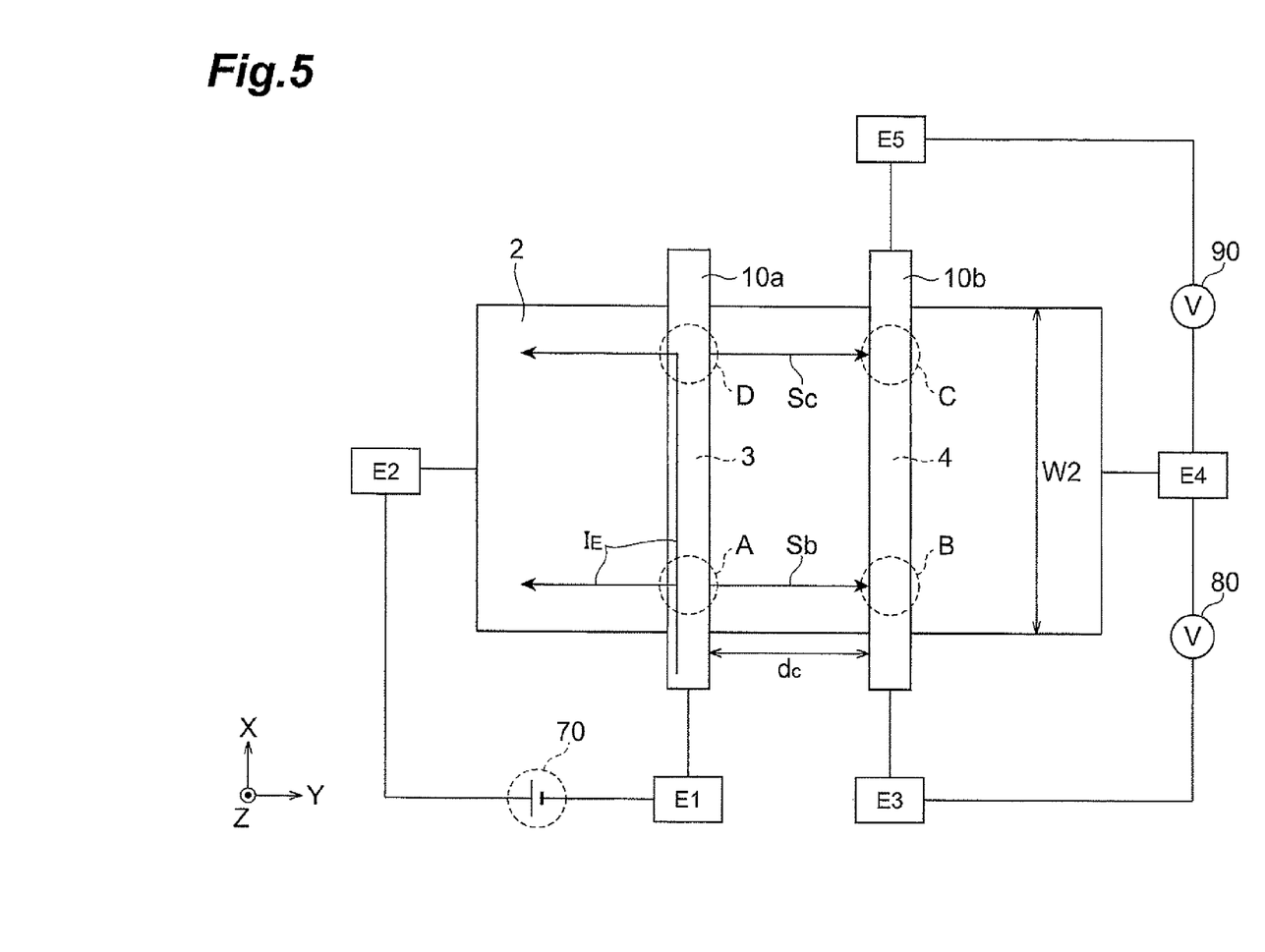
FIG. 5 is a top plan view of the magnetic sensor made by Example 1.

The reason for the above will be explained with reference to FIG. 5. FIG. 5 is a schematic top plan view of a main part of the magnetic sensor made by Example 1.

When caused to flow between the electrodes E1 and E2 in the magnetic sensor made by Example 1, the detection current $I_E$ is presumed to flow more to the nonmagnetic low resistance layer 10a having an electrical resistivity lower than that of the fixed magnetization layer 3, since the nonmagnetic low resistance layer 10a is disposed on the fixed magnetization layer 3.

As illustrated in FIG. 5, the detection current $I_E$ injected from the electrode E1 seems to flow through the nonmagnetic low resistance layer 10a in the longer axis direction (X direction) and from the nonmagnetic low resistance layer 10a to the nonmagnetic conductive layer 2 through the fixed magnetization layer 3. Hence, the detection current $I_E$ injected from the electrode E1 flows into not only the area A but also the area D illustrated in FIG. 5. As a result, it is inferred that an electron spin flow Sb is injected from the area A into the area B, while an electron spin flow Sc is injected from the area D into the area C.

It is therefore presumed that substantially all the spin flows flowing from the nonmagnetic conductive layer 2 to the free magnetization layer 4 travel the distance de between the part of the nonmagnetic conductive layer 2 overlapping the fixed magnetization layer 3 and the free magnetization layer 4, so as to be subjected to a fixed spin resistance, whereby spins having substantially the same size in the X direction can diffuse to the vicinity of the free magnetization layer 4.

Hence, it is inferred that the voltmeters 80, 90 observed substantially the same voltage in the magnetic sensor made by Example 1. Thus, the fluctuation of output voltage is seen to have been reduced regardless of the distance between the current injecting position and output voltage detecting position, since it became easier for a current to flow into the nonmagnetic low resistance layer 10a disposed on the fixed magnetization layer 3.

COMPARATIVE EXAMPLE 1

Figure 6:
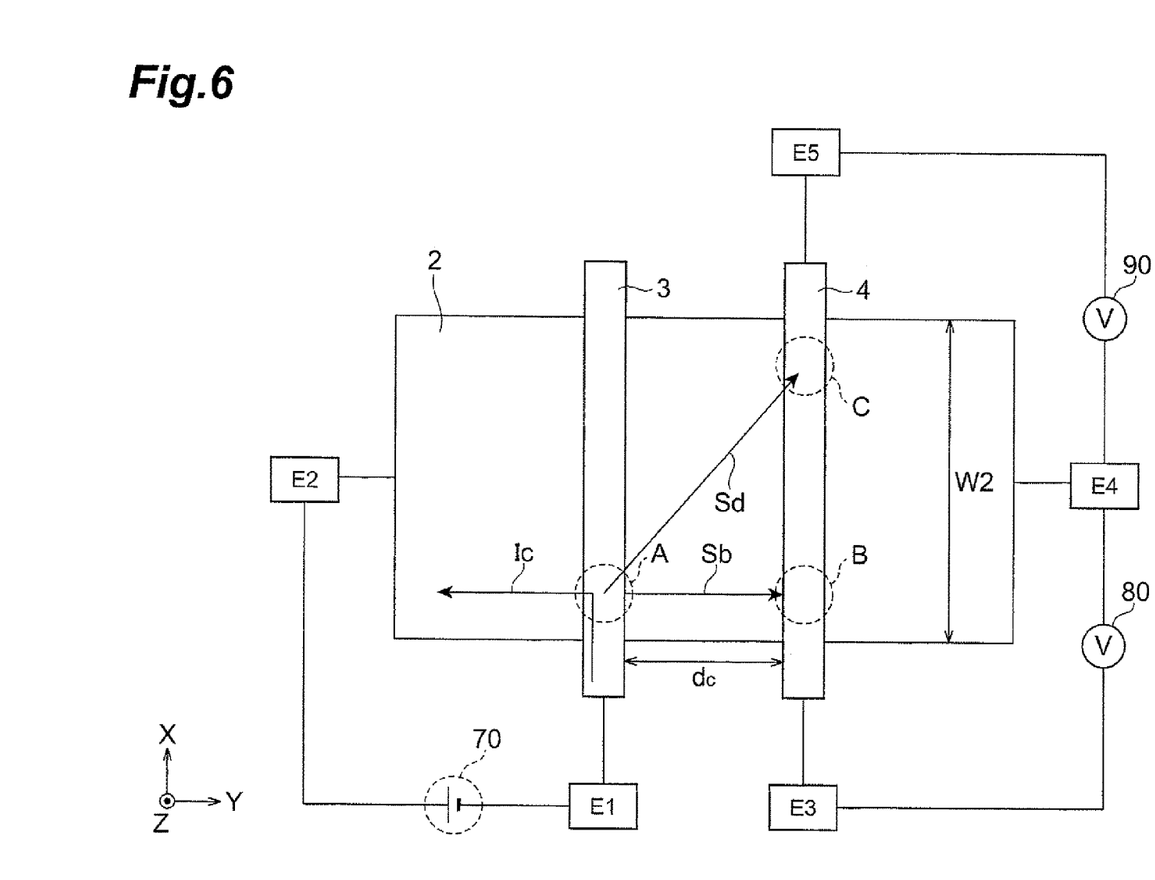
FIG. 6 is a top plan view of the magnetic sensor made by Comparative Example 1.

The magnetic sensor made by Comparative Example 1 differs from the magnetic sensor made by Example 1 in that none of the nonmagnetic low resistance layers 10a, 10b is formed. Therefore, the electrode E1 is connected to the part of the fixed magnetization layer 3 not overlapping the nonmagnetic conductive layer 2, the electrode E3 is connected to one end part of the free magnetization layer 4 not overlapping the nonmagnetic conductive layer 2, and the electrode E5 is connected to the other end part of the free magnetization layer 4 not overlapping the nonmagnetic conductive layer 2. The rest of the structure is the same as that of Example 1 and thus will not be explained.

Evaluation of Output Voltage When Measuring External Magnetic Field

Next, an output voltage caused by an external magnetic field was measured by the magnetic sensor made by Comparative Example 1. As a result, the output voltage observed by the voltmeter 90, i.e., between the electrodes E5 and E4, was 0.27 when the output voltage observed by the voltmeter 80, i.e., between the electrodes E3 and E4, was 1.

This can be explained in the following manner. When caused to flow between the electrodes E1 and E2 in the magnetic sensor made by Comparative Example 1, the detection current Ic is presumed to flow more to the nonmagnetic conductive layer 2 having an electrical resistivity lower than that of the fixed magnetization layer 3.

As a result, the detection current Ic injected from the electrode E1 is supposed to mainly flow from the fixed magnetization layer 3 to the nonmagnetic conductive layer 2 in the vicinity of the area A. This seems to inject an electron spin flow Sb from the area A into the area B and an electron spin flow Sb from the area A into the area C.

Here, while the spin flow Sb flowing from the area A to the area B travels the distance dc between the part of the nonmagnetic conductive layer 2 overlapping the fixed magnetization layer 3 and the free magnetization layer 4, the spin flow Sd flowing from the area A to its diagonally opposite area C is assumed to travel a distance longer than the distance dc. As a consequence, it is inferred that the spin flow Sd is subjected to a higher spin resistance than the spin flow Sb, whereby the output voltage between the electrodes E3 and E4 and the output voltage between the electrodes E5 and E4 deviate from each other. Hence, the magnetic sensor is greatly affected by the connecting position of the electrode E1 with respect to the fixed magnetization layer 3 in the X direction and the connecting positions of the electrodes E3, E5 with respect to the free magnetization layer 4 in the X direction, which is unfavorable.

What is claimed is:
1. A magnetic sensor comprising:
a support;
a nonmagnetic conductive layer disposed on the support;
a fixed magnetization layer having an overlapping part overlapping a first part of the nonmagnetic conductive layer and a non-overlapping part not overlapping the nonmagnetic conductive layer;
a free magnetization layer having an overlapping part overlapping a second part of the nonmagnetic conductive layer different from the first part and a non-overlapping part not overlapping the nonmagnetic conductive layer; and a nonmagnetic low resistance layer, disposed on the overlapping part and the non-overlapping part of each of the fixed magnetization layer and the free magnetization layer, having an electrical resistivity lower than that of each of the fixed magnetization layer and the free magnetization layer, wherein a thickness of the fixed magnetization layer is within a range of 10-100 nm, a thickness of the free magnetization layer is within the range of 10-100 nm, a width of the fixed magnetization layer is within a range of 50-500 nm, a width of the free magnetization layer is within the range of 50-500 nm, and the nonmagnetic low resistance layer is contiguous with both the overlapping part and the non-overlapping part of each of the fixed magnetization layer and the free magnetization layer.

2. A magnetic sensor according to claim 1, wherein the nonmagnetic conductive layer has an electric resistivity lower than that of the at least one of the fixed magnetization layer and the free magnetization layer.

3. A magnetic sensor according to claim 1, wherein the fixed magnetization layer and the free magnetization layer are provided with a coercive force difference therebetween by a shape anisotropy.

4. A magnetic sensor according to claim 1, further comprising an antiferromagnetic layer disposed on the fixed magnetization layer;

wherein the antiferromagnetic layer fixes a direction of magnetization of the fixed magnetization layer.

5. A magnetic sensor according to claim 1, wherein the fixed magnetization layer has a coercive force greater than that of the free magnetization layer.

6. A magnetic sensor according to claim 1, wherein the fixed magnetization layer is made of an alloy or oxide containing at least one element selected from the group consisting of B, V, Cr, Mn, Fe, Co, and Ni.

7. A magnetic sensor according to claim 1, wherein the free magnetization layer is made of an alloy or oxide containing at least one element selected from the group consisting of B, V, Cr, Mn, Fe, Co, and Ni.

8. A magnetic sensor according to claim 1, wherein the nonmagnetic low resistance layer is made of a metal selected from the group consisting of Mg, Al, Cu, Zn, Ag, Au, and Pt or an alloy containing at least one element in the group.

9. A magnetic sensor according to claim 1, further comprising a first electrode contacting the non-overlapping part of at the at least one of the fixed magnetization layer and the free magnetization layer.

10. A magnetic sensor according to claim 1, further comprising a first electrode contacting the non-overlapping part of the nonmagnetic low resistance layer.

11. A magnetic sensor according to claim 1, further comprising:

a second electrode connected to one end of the nonmagnetic conductive layer; and a third electrode connected to an other end of the nonmagnetic conductive layer.

* * * * *